US006574137B2

United States Patent
Voshell et al.

(10) Patent No.: US 6,574,137 B2
(45) Date of Patent: Jun. 3, 2003

(54) SINGLE ENDED ROW SELECT FOR A MRAM DEVICE

(75) Inventors: Tom W. Voshell, Boise, ID (US); Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,646

(22) Filed: Aug. 30, 2001

(65) Prior Publication Data

US 2003/0043619 A1 Mar. 6, 2003

(51) Int. Cl.[7] .............................................. G11C 11/00
(52) U.S. Cl. ...................... 365/158; 365/171; 365/173; 365/230.06
(58) Field of Search ................................. 365/158, 171, 365/173, 225.2, 230.06, 230.03

(56) References Cited

U.S. PATENT DOCUMENTS

| 6,191,972 B1 | * | 2/2001 | Miura et al. | 365/158 |
| 6,256,224 B1 | * | 7/2001 | Perner et al. | 365/171 |
| 6,272,041 B1 | * | 8/2001 | Naji | 365/158 |

* cited by examiner

Primary Examiner—Son Mai
(74) Attorney, Agent, or Firm—Dickstein Shapiro Morin & Oshinsky LLP

(57) ABSTRACT

A method and apparatus for selecting a rowline in a MRAM device. A rowline select circuit is provided on a first side of each rowline and connects the rowline to ground when a memory cell in the rowline is being written to and to a voltage source when a memory cell in the rowline is being read. A rowline stack select circuit is provided on the second side of each rowline and is connected to one rowline on each plane of memory. When a memory cell is being accessed, the rowline containing that memory cell as well as each other rowline connected to the same rowline stack select circuit are connected to a current source.

21 Claims, 4 Drawing Sheets

SINGLE ENDED ROW SELECT FOR A MRAM DEVICE

FIELD OF THE INVENTION

The present invention relates generally to magnetic memory devices, and, more particularly to a method and apparatus for selecting a rowline within a magnetic memory device.

BACKGROUND OF THE INVENTION

A typical MRAM device includes a plurality of planes of memory cells. Each plane of memory cells is divided into rowlines and bit lines. Rowlines, also termed word lines, extend along the rows of the memory cells and bit lines extend along the columns of the memory cells. A bit of information is stored as a resistance value at the intersection of a rowline and a column. The resistance value depends on the orientation of magnetization. The orientation of magnetization will be one of to stable orientations at a given time. These two orientations, parallel and anti-parallel, represent the logical values "1" and "0." The orientation of magnetization of a memory cell can be changed by supplying a current to the rowline and bitline intersecting at the selected memory cell. The currents create magnetic fields, that when combined, can switch the orientation of magnetization of a memory cell from parallel to anti-parallel or vice versa.

As shown in FIG. 1 an MRAM rowline select circuit may employ rowline select circuits 110 and 120 at each end of a rowline. When a memory cell on rowline 100 is accessed, each rowline select circuit 120 determines if that side of the rowline 100 should be connected to ground, voltage source 126 or left floating. This determination is made for each rowline 100, 220, 230 and 240. In addition, each rowline select circuit 110, one of which is connected to the other side of every rowline 100, 220, 230 and 240 in every plane, determines whether the other side of rowline 100 should be connected to current supply 116 or left floating.

Rowline select circuit 120 receives two addressing signals (Add1 and Add2), a WRITE signal and a plane select (PS) signal as inputs. The first addressing signal (Add1) is the output of an address decoding circuit which decodes a portion of the address of the desired rowline. For example, if each plane is broken up into groups of 16 rowlines, the four least significant bits of the address would be fed into the address decoding circuit who's output is the ADD1 signal. The remaining bits of the address are input into another address decoding circuit who's output is the ADD2 signal. If both the ADD1 and ADD2 signals indicate a match, then rowline 100 is the desired rowline. Alternatively, a single address decoding circuit can be used to decode the entire address and NOR gate 125 can be removed from circuit 120, however the approach described above uses wires more economically. The WRITE signal indicates whether the desired memory cell should be written to or read from. The plane select signal (PS) selects one of a plurality of planes of cells in a memory array.

In rowline select circuit 120 and 110, the ADD1 and ADD2 signals are active-low (e.g. when the input is a match, the address decoding circuits output a 0). If the address decoding circuits output a active-high signals, the NOR gates 124, 125 and 115 and NAND gate 114 can be replaced with OR gates and an AND gate to achieve the same functionality.

The first addressing signal (ADD1) and the second addressing signal are input into NOR gate 125. The output of NOR gate 125 is coupled to the gate of transistor 123 which, when turned on, selectively couples transistor 121 to ground. The output of NOR gate 125 and the WRITE signal are input into NOR gate 124. The output of NOR gate 124 is coupled to the gate of transistor 122 which, when turned on, selectively couples voltage supply 126 to transistor 121. The plane select signal is coupled to the gate of transistor 121 which, when turned on, selectively couples rowline 100 to a node between transistors 122 and 123.

Rowline select circuit 110 also receives a WRITE signal, a first addressing signal (ADD1), a second addressing signal (ADD2) and a plane select (PS) signal as inputs. The first addressing signal (ADD1) and the Second addressing signal (ADD2) are input into NOR gate 115. The output of NOR gate 115 is input to NAND gate 114 along with the WRITE signal. The output of NAND gate 114 is input to inverter 113, the output of which is applied to the gate of transistor 112. Transistor 112, when turned on by an output signal from inverter 113, selectively connects current supply 116 to transistor 111. Transistor 111 selectively connects the current from current source 116 passing through transistor 112 to rowline 100 when the plane select signal (PS) is activated.

The various states of circuits 120 and 110 are illustrated in FIG. 4. The only important combinations of the first addressing signal (ADD1), the second addressing signal (ADD2), the WRITE signal, and the plane select (PS) signal are when the first addressing signal (ADD1), the second addressing signal (ADD2) and the plane select signal are all active and when the first addressing signal (ADD1), the second addressing signal (ADD2), the WRITE signal and plane select (PS) signal are all active. The remaining possible combinations either do not occur or are not significant to the operation of circuits 120 and 110.

When the first addressing signal (ADD1) and the second addressing signal (ADD2) are active and the WRITE signal is inactive, a read is taking place on rowline 100. When the first and second addressing signals are active (the signals are low), the state of the WRITE signal is inconsequential to circuit 120. When both addressing signals (ADD1 and ADD2) are active, NOR gate 125 will output a high signal. This output signal will activate transistor 123 (connecting rowline 100 to ground when the PS signal is active) as well as insure that NOR gate 124 outputs a low signal deactivating transistor 122. In addition, circuit 110 leaves the right side floating regardless of the plane select (PS) signal because during a read, the WRITE signal is low causing NAND gate 114 to output a high signal, NOT gate 113 to output a low signal and, as a result, transistor 112 is deactivated. This allows a circuit at the end of a column in the same plane as rowline 100 to determine the orientation of magnetization of a memory cell in rowline 100 based on the resistance.

When the first addressing signal (ADD1), the second address signal (ADD2), the WRITE signal and plane select (PS) signal are all active, a write is taking place on rowline 100. Circuit 120 connects the left side of rowline 100 to ground if the plane select (PS) signal is active and leaves the left side of rowline 100 floating if the plane select (PS) signal is inactive. When both addressing signals (ADD1 and ADD2) are active (the signals are low), NOR gate 125 outputs a high signal activating transistor 123 which connects rowline 100 to ground. In addition, NOR gate 115 outputs a high signal, which, in conjunction with an active WRITE signal, causes NAND gate 114 to output a low signal and NOT gate 113 to output a high signal. This activates transistor 112. Consequently, circuit 110 connects the right side of rowline 100 to current supply 116 if the plane select (PS) signal is active and leaves the right side of rowline 100 floating if the plane select signal is inactive. As a result, for a write to a selected rowline 100 in a selected plane, current flows across rowline 100. In conjunction with a current flowing in the column in the same plane as rowline 100, which may be a current for programming a zero or an opposite current for programming a one, the orientation of magnetization of the memory cell at the intersection of the selected row and column can be changed.

A MRAM device 300, as shown in FIG. 3, is typically connected over a bus to a processor 310. The bus can also connect other peripherals to processor 310, such as, for example, I/O devices 320 and hard drive 315. Processor 310 can then access MRAM device 300 to store data as described above.

Due to the relatively high current needed to program a cell, the transistors needed to switch the programming current are considerably larger than transistors used to switch logic signals and they take up more space.

A simplified rowline select circuit which draws less power and consumes less integrated circuit real estate would be desirable.

BRIEF SUMMARY OF THE INVENTION

The present invention mitigates the problems associated with the prior art and provides a unique method and system of selecting a row in a MRAM device on a single end.

In accordance with an exemplary embodiment of the present invention, the rowline select circuit on one side of each rowline is removed and replaced with a transistor connected to one rowline in each plane of memory cells. This transistor connects every rowline to which it is connected to a current supply when a memory cell in any rowline that it is connected to is being read from or written to. The present invention reduces the number of transistors required to activate a rowline, the power consumed by the rowline control circuits as well as the space that the rowline control circuits uses.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

Figure 2:
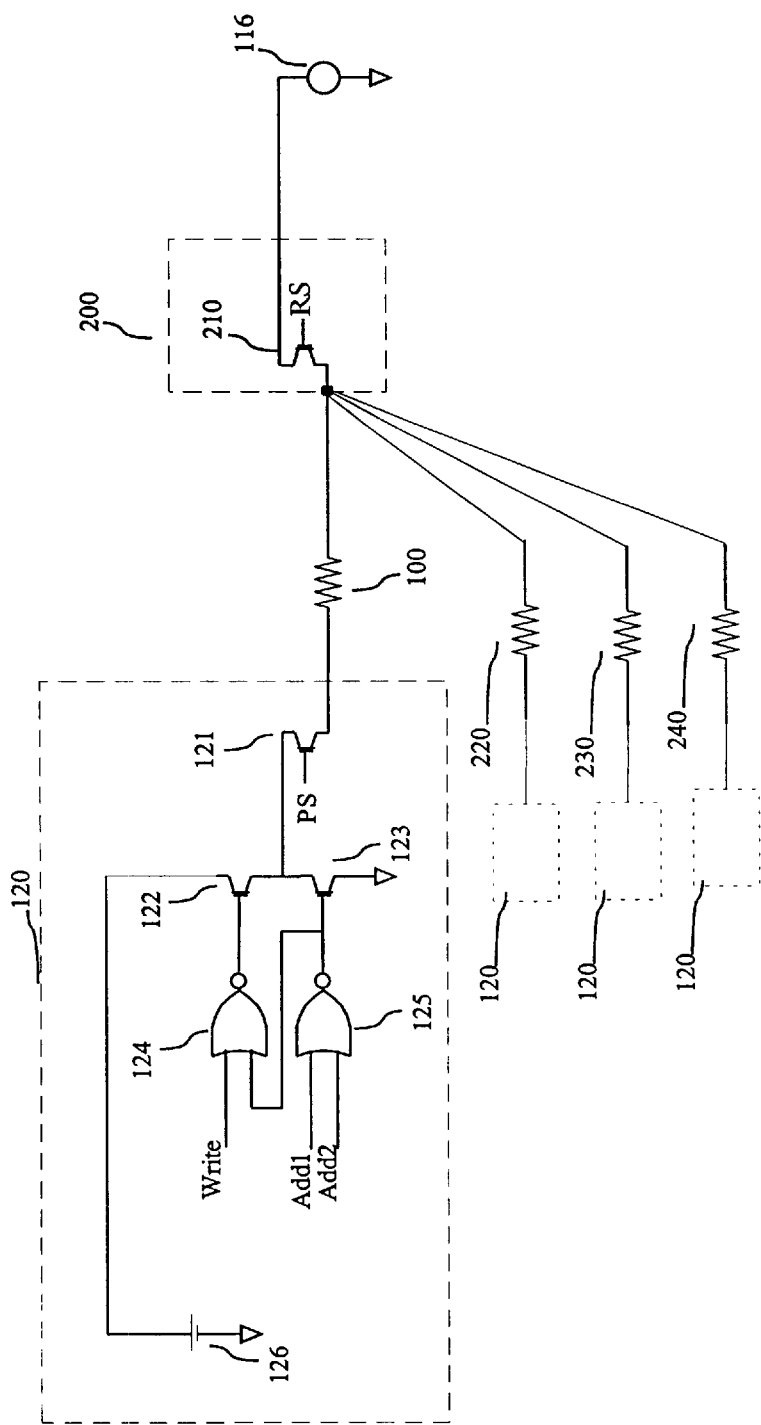
FIG. 2 is a block diagram of an exemplary embodiment of the present invention.
Figure 3:
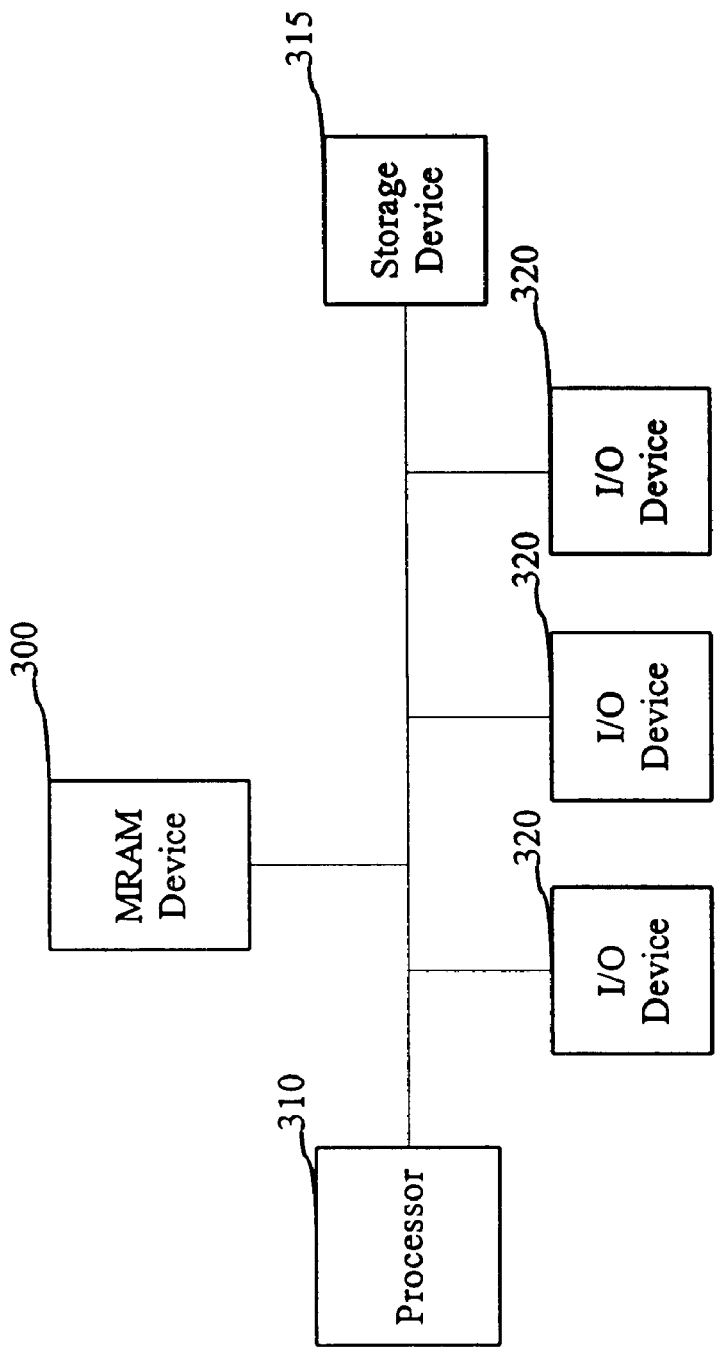
FIG. 3 is a processor circuit which utilizes a MRAM device constructed in accordance with the present invention.
Figure 4:
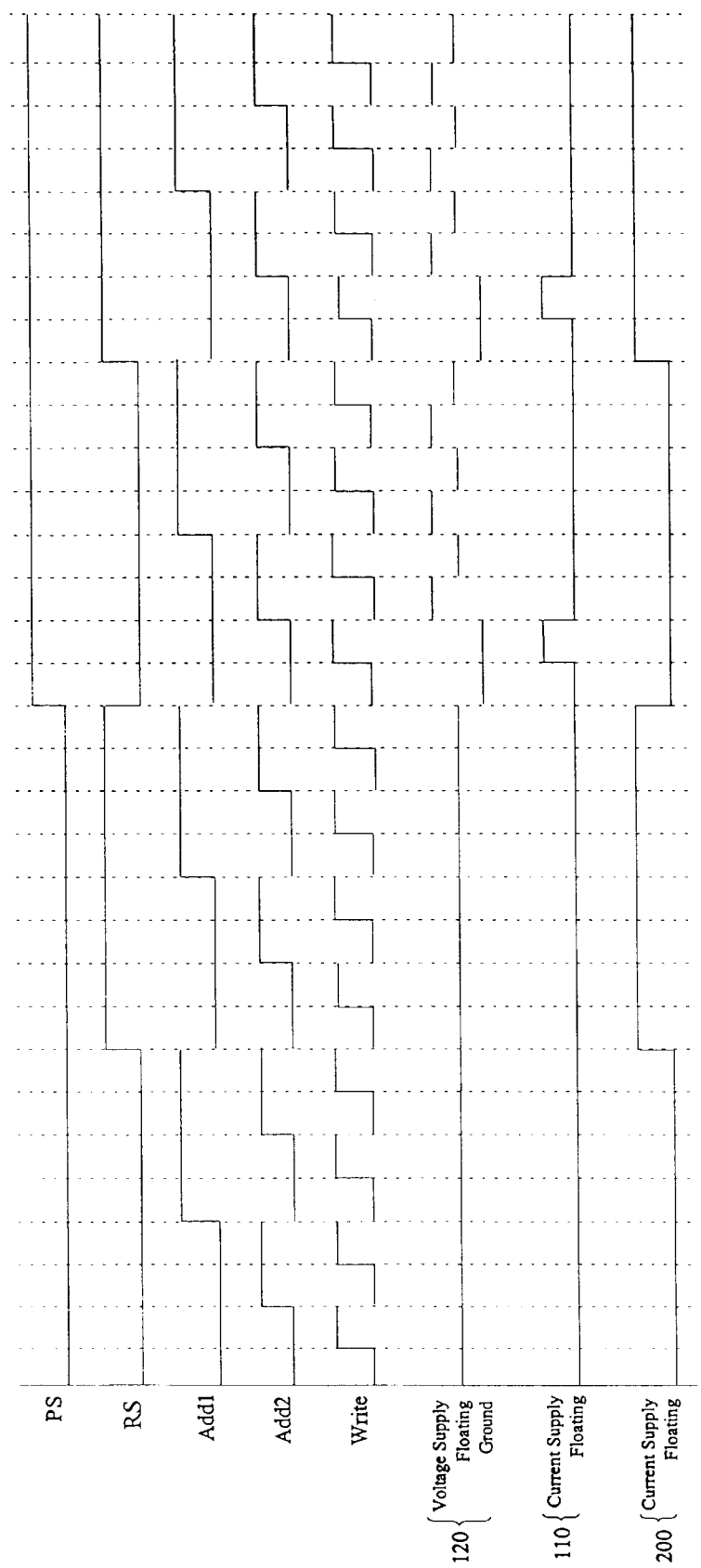
FIG. 4 is a timing diagram for a doubled ended row select for a MRAM device and for an exemplary embodiment of the present invention.

FIG. 2 shows an exemplary embodiment of the present invention. A stack of rowlines is illustrated in FIG. 2. Each rowline in the stack is part of a separate plane of memory cells. Each plane of memory cells is divided into rowlines and column lines.

Figure 1:
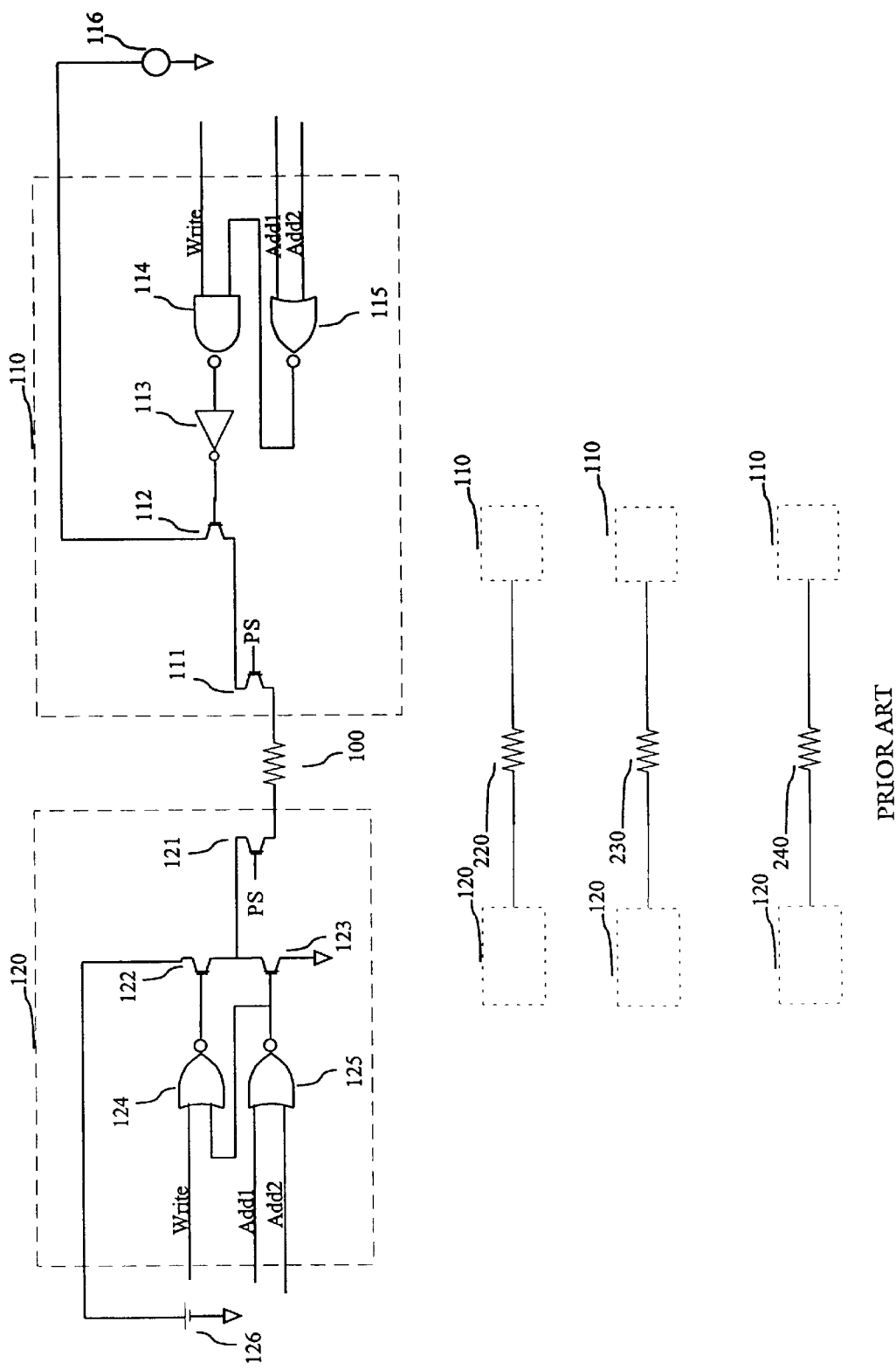
FIG. 1 is a block diagram of a double ended row select for a MRAM device.

FIG. 2 differs from FIG. 1 in that circuit 110 is replaced by circuit 200. As shown in FIG. 2, each stack of rowlines is coupled to a single transistor 210. For example, if a MRAM device has four planes, each plane has four rowlines and each rowline in each plane is numbered for its plane and rowline (e.g. P1R1 [for plane 1, rowline 1], P1R2, P1R3, P1R4, P2R1, P2R2, etc.) then P1R1, P2R1, P3R1 and P4R1 are a "stack" and would all be connected to one circuit 200. This reduces the number of transistors on one side of each rowline (circuit 110 has two transistors, a NOR gate, a NAND gate and a NOT gate while circuit 200 has only 1 transistor) as well as the total number of transistors on one side of a MRAM device; instead of connecting a separate circuit 110 to one side of each rowline, circuit 200 is collected to a stack of rowlines in different memory planes. In addition to circuit simplification, the performance of duplicate tasks on one side of a MRAM device is reduced for a selection operation.

Selection circuit 200 also differs from circuit 110 in that a rowline stack (RS) signal, which is active high, is applied to transistor 210 and used to select rowlines by stack. The rowline stack (RS) signal is the output of an address decoding circuit which indicates when a rowline 100 in a particular stack of rowlines is selected. As further illustrated in FIG. 2, transistor 210 is coupled to a current supply 116 and to a stack of rowlines 100, 220, 230 and 240. Transistor 210 selectively connects current supply 116 to stacked rowlines 100, 220, 230 and 240 when the rowline stack (RS) signal is active for stack selection.

Since circuit 120 selects a rowline 100 in the same plane as the desired rowline with a plane select (PS) signal and circuit 200 selects a rowline 100 in the same stack of rowlines as the desired rowline with a rowline stack (RS) signal, the only time both circuit 120 and circuit 200 will be active is when a particular rowline 100 in a plane and stack is addressed.

Although, circuit 200 connects the right side of a rowline 100 to current source 116 when the rowline stack (RS) signal is active, the same addressing capability for a selected rowline is retained for read and write operations by virtue of selection circuit 120.

While the invention has been described with reference to exemplary embodiments various additions, deletions, substitutions, or other modifications may be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of selecting a rowline for a magnetic random access memory (MRAM) device comprising:

connecting a first side of a selected rowline of said MRAM device to a voltage supply when a memory cell in said selected rowline is to be read;

connecting a first side of the selected rowline to ground when a memory cell in said selected rowline is to be written to;

connecting a second side of a plurality of rowlines in a stack of rowlines residing in different memory planes, including said selected rowline, to a current supply when a memory cell in said selected rowline is being read or written to.

2. A method as in claim 1, wherein when said memory cell is written to, the magnetization of orientation of a memory cell is modified to store a bit of data in said memory cell.

3. A method as in claim 1, wherein when said memory cell is read, the magnetization of orientation of a memory cell is determined to retrieve a bit of data from said memory cell.

4. A method as in claim 1, wherein said second side of said plurality of rowlines is connected to said current supply when a rowline stack signal is activated.

5. A memory storage device comprising:
   a plurality of planes of memory cells, each said plane containing a plurality of column lines and a plurality of rowlines and memory cells corresponding to the intersection of said column lines and rowlines;
   a plurality of first rowline select circuits each coupled to a first side of a respective one of said plurality of rowlines in each plane; and
   a plurality of second rowline select circuits each coupled to a current supply and each coupled to a second side of a rowline on each of said plurality of planes of memory cells, said rowlines in said planes forming a stack of rowlines and being activated in response to a rowline stack signal;
   wherein when a memory cell in one of said plurality of planes of memory cells is accessed, said rowline stack signal activates a stack of rowlines which includes a rowline containing said memory cell being accessed; and
   when a memory cell in said plane of memory cells is being read, a first rowline select circuit coupled to the rowline containing said memory cell being read connects said rowline containing said read memory cell being read to a voltage source; and
   when a memory cell in said plane of memory cells is being written to, the rowline select circuit coupled to the rowline containing said memory cell being written to connects said rowline to ground.

6. A rowline select circuit for a MRAM device comprising:
   a current supply;
   a transistor having a first source/drain terminal directly coupled to said current supply; and
   a rowline coupled to a second source/drain terminal of said transistor, said transistor selectively connecting said current supply to one side of said rowline in said MRAM device when a memory cell in said rowline is being accessed.

7. The rowline select circuit as in claim 6, wherein said transistor is coupled to one rowline in each of a plurality of memory cell planes of said MRAM device.

8. The rowline select circuit as in claim 6, wherein another side of said rowline is coupled to a voltage source when a selected memory cell in said rowline is being read.

9. The rowline select circuit as in claim 6, wherein another side of said rowline is coupled to ground when a selected memory cell in said rowline is being written to.

10. A processor circuit comprising:
    a processor; and
    a MRAM device coupled to said processor;
    a first rowline select circuit for connecting a first side of a rowline in said MRAM device to a voltage source when a memory cell in said rowline is being read, said rowline select circuit connecting a first side of said rowline to a ground when a memory cell in said rowline is being written to; and
    a second rowline select circuit for connecting a second side of a plurality of rowlines in said MRAM device in different planes of memory cells to a current supply when a memory cell in one of said plurality of rowlines is being accessed.

11. A processor circuit comprising:
    a processor;
    a MRAM device coupled to said processor, said MRAM device comprising:
       a plurality of planes of memory cells, each of said plurality of planes comprising a first plurality of rowlines and a plurality of column lines and memory cells at the intersection of said rowlines and column lines;
       a plurality of first rowline plane select circuits, each first rowline select circuit coupled to the first side of one of said first plurality of rowlines; and
       a plurality of second rowline select circuits, each second rowline select circuit coupled to the second side of a second plurality of rowlines residing in different memory planes.

12. A processor circuit as in claim 11, wherein said second rowline select circuit connects said second side of said second plurality of rowlines to a current supply when a memory cell in one of said second plurality of rowlines is accessed.

13. A processor circuit as in claim 11, wherein said second rowline select circuit comprises:
    a current supply; and
    a transistor coupled to said current supply for supplying current from said current supply to said second plurality of rowlines.

14. A processor circuit as in claim 11, wherein said first rowline select circuit connects said first side of one of said first plurality of rowlines to a voltage source when a memory cell in said one rowline is being read and to ground when a memory cell in said one rowline is being written to.

15. A processor circuit as in claim 11, wherein each said first rowline select circuit comprises:
    a voltage supply;
    a first NOR gate having one input coupled to the output of a second NOR gate and a second input for receiving a WRITE signal;
    a first transistor having a gate coupled to an addressing signal and source and drain terminals for coupling a selected rowline to ground;
    a second transistor having a gate coupled to the output of said first NOR gate and source and drain terminals for coupling a voltage source to a selected rowline; and
    a third transistor having a gate for receiving a plane select signal and having source and drain terminals for coupling a selected rowline to source/drain terminals at said first and second transistors.

16. A processor circuit as in claim 15, wherein said addressing signal is the output of a decoding circuit that receives the address of the desired rowline as an input and outputs a signal to indicate if the rowline coupled to said processor circuit is the desired rowline.

17. A processor circuit as in claim 15, further comprising a second NOR gate coupled to the gate of said first transistor, said second NOR gate receiving a first and second addressing signal as inputs.

18. A processor circuit as in claim 17, wherein said first addressing signal is the output of a first decoding circuit, said first decoding circuit receiving a portion of the address of the desired rowline as an input and outputting a signal to indicate said input and the corresponding portion of the address of the desired rowline are identical; and wherein said second addressing signal is the output of a second decoding circuit, said second decoding circuit receiving the portion of the address of the desired rowline that said first decoding circuit did not receive as an input and outputting a signal to indicate if said input and the portion of the address of the rowline coupled to said processor circuit corresponding to the portion of the address of the desired rowline received as in input are identical.

19. A processor circuit as in claim 11, wherein each said first rowline select circuit comprises:

a voltage supply;

a first NOR gate having one input coupled to the output of a second NOR gate and a second input for receiving a WRITE signal;

a first transistor having a gate coupled to an output of said second NOR gate and source and drain terminals for coupling a selected rowline to ground, said second NOR gate receiving first and second addressing signals at its inputs;

a second transistor having a gate coupled to the output of said first NOR gate and source and drain terminals for coupling a voltage source to a selected rowline; and a third transistor having a gate for receiving a plane select signal and having source and drain terminals for coupling a selected rowline to source/drain terminals at said first and second transistors.

20. A processor circuit as in claim 19, wherein said addressing signal is the output of a decoding circuit that receives the address of the desired rowline as an input and outputs a signal to indicate if the rowline coupled to said processor circuit is the desired rowline.

21. A processor circuit as in claim 19, wherein said first addressing signal is the output of a first decoding circuit, said first decoding circuit receiving a portion of the address of the desired rowline as an input and outputting a signal to indicate said input and the corresponding portion of the address of the desired rowline are identical; and wherein said second addressing signal is the output of a second decoding circuit, said second decoding circuit receiving the portion of the address of the desired rowline that said first decoding circuit did not receive as an input and outputting a signal to indicate if said input and the portion of the address of the rowline coupled to said processor circuit corresponding to the portion of the address of the desired rowline received as an input are identical.

* * * * *